United States Patent
McLeod et al.

(10) Patent No.: US 11,619,880 B2
(45) Date of Patent: Apr. 4, 2023

(54) HOLOGRAPHIC PHOTOPOLYMER COMPOSITIONS AND COMPOSITES

(71) Applicant: The Regents of the University of Colorado, Denver, CO (US)

(72) Inventors: Robert R. McLeod, Boulder, CO (US); David Glugla, Denver, CO (US)

(73) Assignee: The Regents of the University of Colorado, Denver, CO (US)

( * ) Notice: Subject to any disclaimer, the term of this patent is extended or adjusted under 35 U.S.C. 154(b) by 0 days.

(21) Appl. No.: 16/876,893

(22) Filed: May 18, 2020

(65) Prior Publication Data

US 2020/0363714 A1 Nov. 19, 2020

Related U.S. Application Data

(60) Provisional application No. 62/849,407, filed on May 17, 2019.

(51) Int. Cl.
| | | |
|---|---|---|
| *G03H 1/02* | (2006.01) | |
| *G03F 7/004* | (2006.01) | |
| *G03H 1/18* | (2006.01) | |
| *G03F 7/00* | (2006.01) | |

(52) U.S. Cl.
CPC ............... *G03F 7/001* (2013.01); *G03H 1/02* (2013.01); *G03H 2001/0264* (2013.01); *G03H 2001/186* (2013.01); *G03H 2260/12* (2013.01)

(58) Field of Classification Search
CPC ...................................................... G03F 7/001
See application file for complete search history.

(56) References Cited

U.S. PATENT DOCUMENTS

| | | | | |
|---|---|---|---|---|
| 4,588,664 | A * | 5/1986 | Fielding | G03F 7/001 427/514 |
| 4,942,102 | A * | 7/1990 | Keys | B32B 17/10036 430/1 |
| 4,970,129 | A * | 11/1990 | Ingwall | G03F 7/001 359/3 |
| 5,024,909 | A * | 6/1991 | Smothers | G03F 7/001 359/28 |
| 5,098,804 | A * | 3/1992 | Booth | G02B 6/124 430/311 |

(Continued)

FOREIGN PATENT DOCUMENTS

| | | | |
|---|---|---|---|
| CN | 109752779 | * | 5/2019 |
| JP | 2004-318069 | * | 11/2004 |
| WO | 2017/207958 | * | 12/2017 |

OTHER PUBLICATIONS

Shoji et al. "photofabrication of three-dimensional photonic crystals by multibeam laser interference into a photopolymerizable resin", Appl. Phys. vol. 76(19) 2668-2670 (May 2000).*

(Continued)

*Primary Examiner* — Martin J Angebranndt
(74) *Attorney, Agent, or Firm* — Saul Ewing, LLP; Kathryn Doyle; Domingos J. Silva

(57) ABSTRACT

The present disclosure relates in one aspect to methods of preparing non-homogeneous polymer materials wherein light is used to control structure and/or composition. In certain embodiments, the present disclosure provides methods for creating gradient index optical elements including holographic elements.

16 Claims, 4 Drawing Sheets

(56) References Cited

U.S. PATENT DOCUMENTS

| | | | | |
|---|---|---|---|---|
| 5,098,904 | A * | 3/1992 | Mattson | C07D 401/14 514/256 |
| 5,198,912 | A * | 3/1993 | Ingwall | G02F 1/13342 349/130 |
| 5,565,302 | A * | 10/1996 | Samukawa | G03F 7/033 430/281.1 |
| 7,186,567 | B1 * | 3/2007 | Sutherland | G01N 33/54366 252/582 |
| 2003/0152842 | A1 * | 8/2003 | Cetin | G03F 7/0755 430/1 |
| 2004/0027625 | A1 * | 2/2004 | Trentler | G11B 7/26 |
| 2004/0223693 | A1 * | 11/2004 | Wang | G02B 5/1857 385/37 |
| 2005/0007639 | A1 * | 1/2005 | Natarajan | G03H 1/0005 359/15 |
| 2005/0016441 | A1 * | 1/2005 | Masutani | G02F 1/1334 117/2 |
| 2006/0028634 | A1 * | 2/2006 | Tuberfield | B82Y 20/00 355/77 |
| 2006/0194120 | A1 * | 8/2006 | Cole | G03H 1/02 430/1 |
| 2006/0210233 | A1 * | 9/2006 | Yeo | B82Y 20/00 385/147 |
| 2007/0184353 | A1 * | 8/2007 | Satou | G03F 7/035 430/1 |
| 2007/0189672 | A1 * | 8/2007 | Yamaguchi | G02B 6/138 385/49 |
| 2007/0279745 | A1 * | 12/2007 | Klemann | G02B 5/1847 359/566 |
| 2009/0218519 | A1 * | 9/2009 | McLeod | G03F 7/70416 250/492.1 |
| 2009/0246643 | A1 * | 10/2009 | Tomita | B82Y 30/00 430/2 |
| 2010/0020373 | A1 * | 1/2010 | Askham | G03F 7/027 359/3 |
| 2015/0037535 | A1 * | 2/2015 | Akimoto | C09C 1/3072 428/141 |
| 2022/0119567 | A1 * | 4/2022 | Bowman | C08G 18/672 |

OTHER PUBLICATIONS

Xu et al. "Electrodeposition of three-dimensional titania photonic crystals from holographically patterned microporous polymer templates", Chem. Mater., vol. 20(5) 1816-1820 (2008).*
Moon et al., "Core shell diamond like photonic crystals form 3D polymer templates created by holographic lithography" Opt. Express. vol. 14(13) pp. 6297-6302 (Jun. 2006).*
Hsieh et al., "A low cost and large scale synthesis of 3D photonic crystal with SP@ lattice symmetry" AIP advances 9 085206 (Sep. 2019).*
Machine translation of JP 2004-318069 (Nov. 2004).*
Sones et al., "Laser-induced photo-polymerization for creation of paper-based fluidic devices" Lab Chip, 14 pp. 4567-4574 (2014).*
He et al., "Engineering fluidic delays in paper based devices using laser direct writing", Lab Chip vol. 15(20) pp. 4054-4061 (Oct. 2015 ).*
Alim, et al., "A photopolymerizable thermoplastic with tunable mechanical performance", Mater. Horizons, 2020.
Arcaute, et al., "Stereolithography of spatially controlled multi-material bioactive poly(ethylene glycol) scaffolds", Acta Biomater., 6,, 2009, 1047-1054.
Borrello, et al., "3D printing a mechanically-tunable acrylate resin on a commercial DLP-SLA printer", Addit. Manuf., 23, 2018, 374-380.
Chan, et al., "Multi-material bio-fabrication of hydrogel cantilevers and actuators with stereolithography", Lab Chip., 12, 2012, 88-98.
Chen, et al., "Multi-material Additive Manufacturing of Metamaterials with Giant, Tailorable Negative Poisson's Ratios", Sci. Rep., 8, 2018.
Choi, et al., "Multi-material stereolithography", J. Mater. Process. Technol., 211, 2011, 318-328.
Choong, et al., "4D printing of high performance shape memory polymer using stereolithography", Mater. Des., 126, 2017, 219-225.
Compton, et al., "3D-printing of lightweight cellular composites", Adv. Mater., 26, 2014, 5930-5935.
Dewaele, et al., "Volume contraction in photocured dental resins: The shrinkage-conversion relationship revisited", Dent. Mater., 22, 2006, 359-365.
Han, et al., "Rapid multi-material 3D printing with projection micro-stereolithography using dynamic fluidic control", Addit. Manuf., 27, 2019, 606-615.
Inzana, et al., "3D printing of composite calcium phosphate and collagen scaffolds for bone regeneration", Biomaterials., 35, 2014, 4026-4034.
Ituarte, et al., "Design and additive manufacture of functionally graded structures based on digital materials", Addit. Manuf., 2019.
Kokkinis, et al., "3D Printing of Materials with Tunable Failure via Bioinspired Mechanical Gradients", Adv. Mater., 30, 2018.
Kowsari, et al., "High-Efficiency High-Resolution Multimaterial Fabrication for Digital Light Processing-Based Three-Dimensional Printing, 3D Print", Addit. Manuf., 5, 2018, 185-193.
Kuang, et al., "Grayscale digital light processing 3D printing for highly functionally graded materials", Sci. Adv., 5, 2019.
Layani, et al., "Novel Materials for 3D Printing by Photopolymerization", Adv. Mater. 30, 2018, 1706344.
Lee, et al., "Fundamentals and applications of 3D printing for novel materials", Appl. Mater. Today, 7, 2017, 120-133.
Li, et al., "Printing continuously graded interpenetrating polymer networks of acrylate/epoxy by manipulating cationic network formation during stereolithography", Express Polym., Lett. 10, 2016, 1003-1015.
Lopes, et al., "Laser curing of silver-based conductive inks for in situ 3D structural electronics fabrication in stereolithography", J. Mater. Process. Technol., 214, 2014, 1935-1945.
Matlack, et al., "C.D. Designed, A.P. Performed, Composite 3D-printed metastructures for low-frequency and broadband vibration absorption", PNAS, 113 (30), Jul. 26, 2016, 8386-8390.
Muralidharan, et al., "Stereolithographic 3D Printing for Deterministic Control over Integration in Dual-Material Composites", Adv. Mater. Technol., 2019.
Ngo, et al., "Additive manufacturing (3D printing): A review of materials, methods, applications and challenges", Compos Part B Eng., 143, 2018, 172-196.
Palaganas, et al., "3D printing of photocurable cellulose nanocrystal composite for fabrication of complex architectures via stereolithography", ACS Appl. Mater. Interfaces , 9, 2017, 34314-34324.
Ronca, et al., "Preparation of designed poly(d,l-lactide)/nanosized hydroxyapatite composite structures by stereolithography", Acta Biomater., 9, 2013, 5989-5996.
Schuller-Ravoo, et al., "Flexible and elastic scaffolds for cartilage tissue engineering prepared by stereolithography using poly(trimethylene carbonate)-based resins, Macromol. Biosci. 13 (2013) 1711-1719.", Macromol. Biosci., 13, 2013, 1711-1719.
Studart, "Additive manufacturing of biologically-inspired materials", Chem. Soc. Rev., 45, 2016, 359-376.
Sun, et al., "Projection micro-stereolithography using digital micro-mirror dynamic mask", Sensors Actuators, A Phys., 121, 2005, 113-120.
Tumbleston, et al., "Continuous liquid interface production of 3D objects", Science (80-.), 347, 2015, 1349-1352.
Uzcategui, et al., "Understanding and Improving Mechanical Properties in 3D printed Parts Using a Dual-Cure Acrylate-Based Resin for Stereolithography", Adv. Eng. Mater., 20, 2018.
Walker, et al., "Rapid, large-volume thermally controlled 3D printing using a mobile liquid interface", Science (80-.), 366, 2019, 360-364.
Xu, et al., "Additive Manufacturing of Two-Phase Lightweight, Stiff and High Damping Carbon Fiber Reinforced Polymer Microlattices", Addit. Manuf., 32, 2020, 101106.
Yang, et al., "3D Printed Photoresponsive Devices Based on Shape Memory Composites", Adv. Mater., 29, 2017.

(56) References Cited

OTHER PUBLICATIONS

Yin, et al., "Orthogonal programming of heterogeneous micro-mechanoenvironments and geometries in three-dimensional bio-stereolithography", Nat Commun., 9, 2018.

* cited by examiner

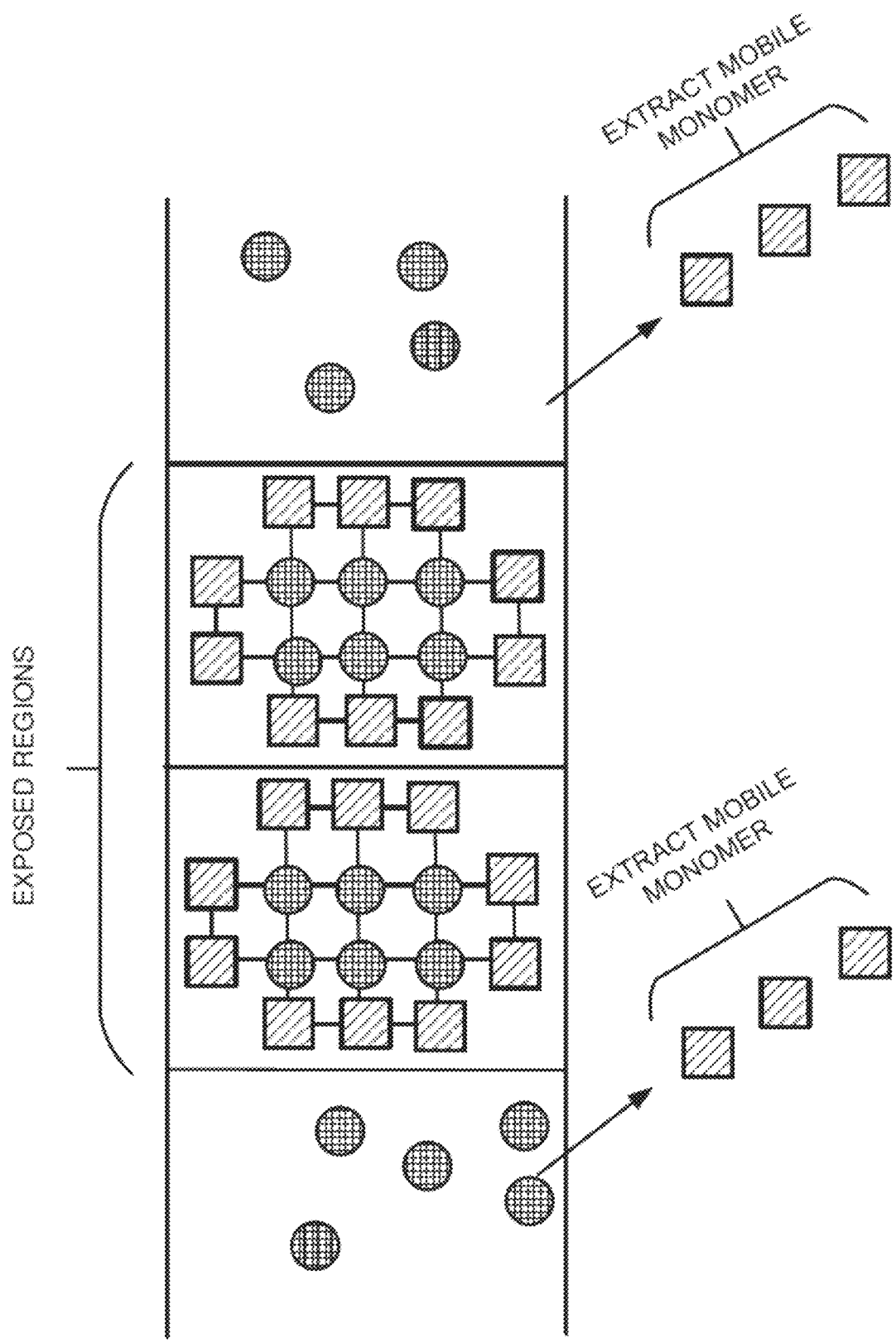

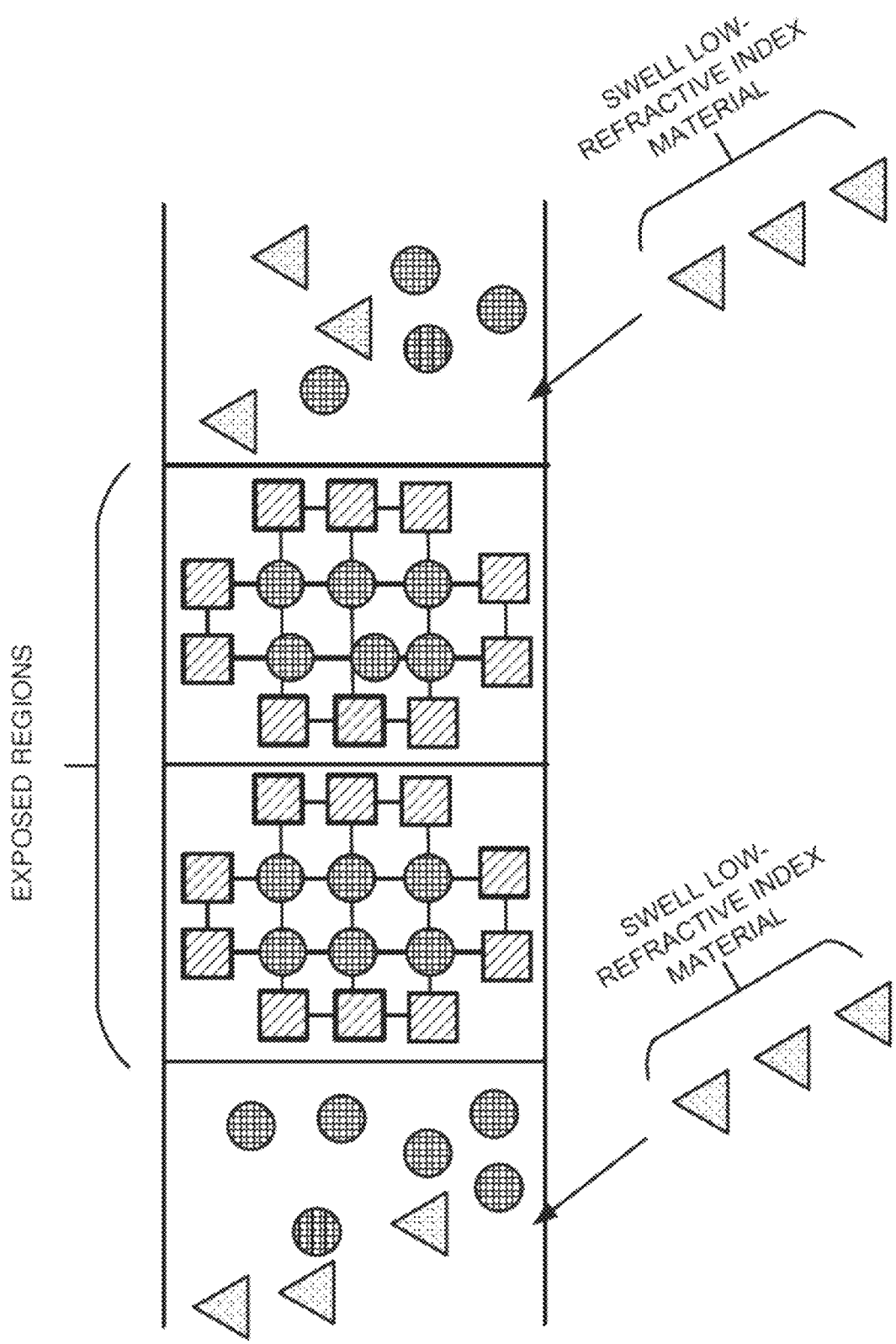

HOLOGRAPHIC PHOTOPOLYMER COMPOSITIONS AND COMPOSITES

CROSS-REFERENCE TO RELATED APPLICATIONS

The present application claims priority under 35 U.S.C. § 119(e) to U.S. Provisional Application No. 62/849,407 filed May 17, 2019, which is hereby incorporated by reference in its entirety herein.

BACKGROUND OF THE INVENTION

Two-stage photopolymers are an ideal framework for designing materials capable of accessing a wide range of material properties (such as, but not limited to, mechanical, thermal, optical, electrical, and so forth) using optical patterning.

A valuable implementation of the two stage paradigm is found in designing recording materials (often referred to as holographic photopolymers) for appropriate refractive index (phase) structures using various optical exposure techniques (such as, but not limited to, photolithography, direct laser write or DLW, two-photon lithography, and holography) to generate a refractive index contrast ($\Delta n$) between the bulk material and the recorded feature(s).

The data storage application has historically been the primary driver of the materials technology. Unfortunately, the operating environment for rewriteable discs is significantly constrained. For example, an optical storage disk is typically inserted into a drive of a computer (the constrained environment) and a laser is used to write data by creating a change within photopolymer within the disc. After the disk is made to be insensitive to light (typically by consuming all of the photo-reactive species using sufficient optical dose), the data written on the disc can be read. This environment limits the processing that can be done to the material, for example thermal or chemical processes.

A second important application of holographic photopolymers is found in holographic optical elements (for example, for use in augmented reality). In particular, the advent of augmented reality (AR) devices has spurred a rising interest to use photopolymers to fabricate holographic optical elements (HOEs) capable of complex, yet high-quality, optical functions with thin, light, and flexible form factors. The applications and design requirement of the HOEs are varied. While the creation of these optical elements, is not constrained to a limited environment (such as the disc drive of a computer), techniques are still needed for creating improved elements.

There remains a need in the art for identifying novel methods of preparing holographic optical elements with controllable and useful properties. The present invention addresses and fulfills these needs.

BRIEF SUMMARY OF THE INVENTION

The present invention provides methods of generating a composite material. The present invention further provides composite materials having a gradient refractive index throughout its structures. In certain embodiments, the invention contemplates creating a latent pattern within a solid matrix and having a filler distributed within the solid matrix as controlled at least partially by the latent pattern. Additional non-limiting embodiments of the present invention are described elsewhere herein.

BRIEF DESCRIPTION OF THE DRAWINGS

For the purpose of illustrating the invention, certain embodiments of the invention are depicted in the drawings. However, the invention is not limited to the precise arrangements and instrumentalities of the embodiments depicted in the drawings.

FIGS. 1A-1C illustrate non-limiting examples of post-processing of a photopolymer to create an enhanced refractive index change between exposed and unexposed regions in accordance with certain embodiments of the present disclosure.

DETAILED DESCRIPTION OF THE INVENTION

Figure 1A:
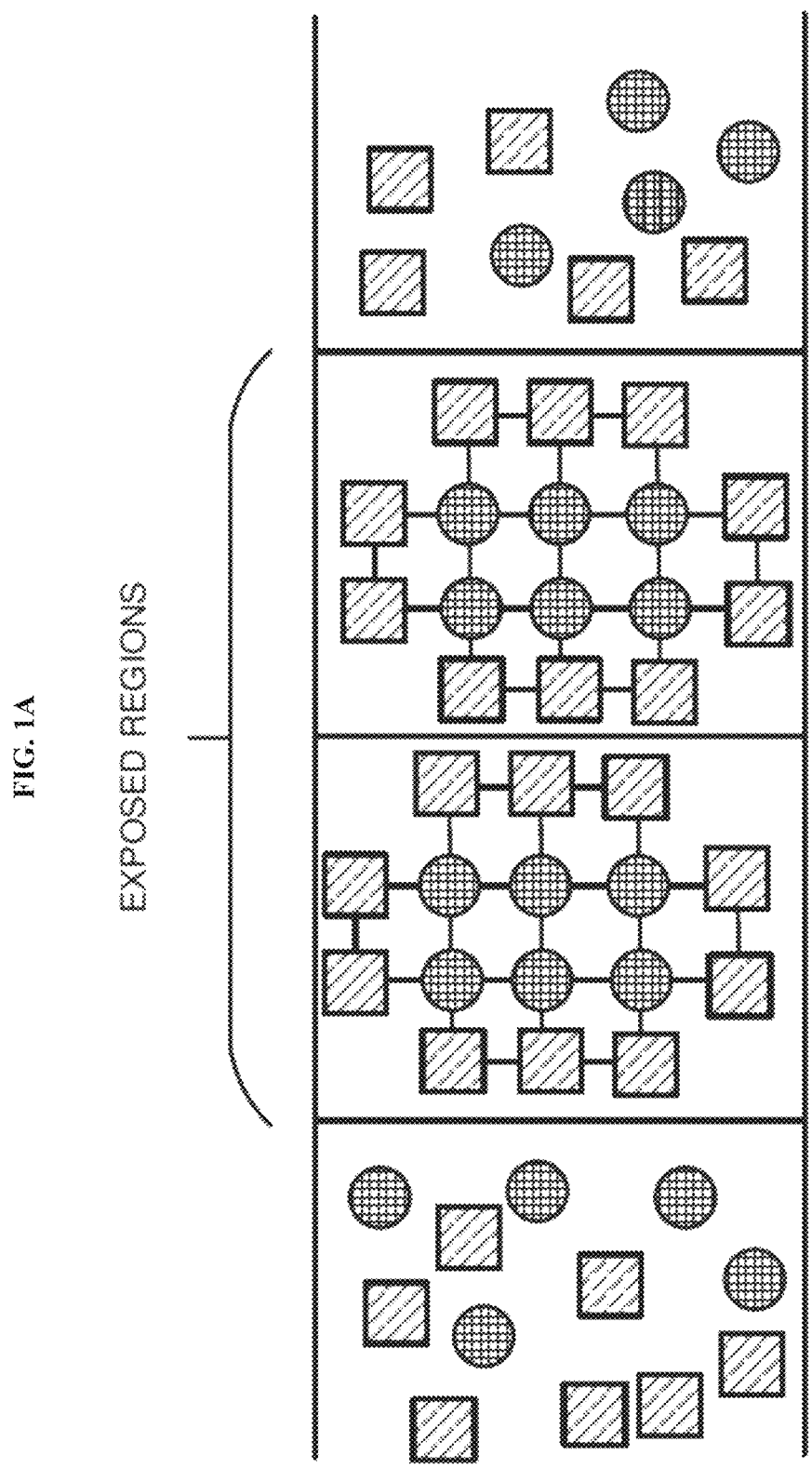

The present disclosure relates in one aspect to methods of preparing non-homogeneous polymer materials wherein light, or another suitable agent and/or reagent, is used to control structure and/or composition. In certain embodiments, the present disclosure provides methods for creating gradient index optical elements, including but not limited to holographic elements.

In certain embodiments, the gradient index optical element created can be mixtures where the constituent materials are partially segregated due to the photopolymerization processes. In certain embodiments, the invention provides improved formulations and processing methods that produce materials with outstanding performance, including higher refractive index contrast, reduced absorption, reduced haze, improved dimensional control, reduced stress, and/or greater control over final mechanical properties.

Two-stage photopolymers are an ideal framework for designing materials capable of accessing a wide range of material properties (e.g., mechanical, thermal, optical, electrical, and so forth) using on-demand light. A valuable implementation of the two-stage paradigm is in designing recording materials (often referred to as holographic photopolymers) for appropriate refractive index (phase) structures using various optical exposure techniques (such as photolithography, direct laser write (DLW), two-photon lithography, and holography) to generate a refractive index contrast ($\Delta n$) between the bulk material and the recorded feature(s).

These traditional methods, often out of necessity dictated by the operating environment (e.g., because the objects were in a package to facilitate an intended application), leave the exposed and unexposed regions of the object with very similar structural properties, varying only by the changes induced by optical exposure.

In contrast, the present methods intentionally create a dramatic change in the properties using post-processing techniques to enhance performance of the polymer object. For example, in certain embodiments, the present methods exploit spatial variations in the degree to which constituents can be extracted and/or applied fillers can swell into the material, using for example spatial variation in polymerization degree.

In certain embodiments, a (support) matrix is used to provide a solid scaffold, through which the other liquid or soluble components can diffuse and with which other components can react. This scaffold can be a thermoset, step growth polymer, such as but not limited to a urethane or thiol-ene, as well as any other suitable polymer known in the art. The solid scaffold can, in certain embodiments, swell in and allow for transport of liquid (or dissolved) components within its structure. The matrix can be permeable to the other components contemplated within the invention and can be a "soft" polymer (for example, a polymer with glass transition temperature below the recording temperature). In certain embodiments, the matrix can further have reactive sites that allow for covalent or non-covalent bonding with components contemplated within the invention.

In certain embodiments, the support matrix comprises a covalent adaptable network (CAN). CANs comprise reversible covalent crosslinks that are most commonly (re)formed through photochemical or thermal routes. The reversibility of the covalent bonds allows for healable and reshapable thermoset materials. In other embodiments, the CAN comprises at least one first multifunctional monomer comprising at least two reactive end groups. In other embodiments, the support matrix comprises a covalent adaptable network comprising at least one second multifunctional monomer comprising at least one reversible addition-fragmentation chain transfer (RAFT) functionality in the monomer backbone and at least two reactive end groups capable of forming a covalent bond with the reactive end groups of the at least one first multifunctional monomer.

In certain embodiments, the at least one first multifunctional monomer is selected from a difunctional monomer, a trifunctional monomer, and a tetrafunctional monomer. In other embodiments the at least one first multifunctional monomer comprises at least one end group that polymerizes ionically and/or in the presence of a Lewis acid catalyst. In yet other embodiments, the at least one first multifunctional monomer comprises at least one end group selected from the group consisting of an isocyanate group, cyanate group, epoxide group, Michael acceptor, primary amine, secondary amine, alcohol, thiol, carboxylic acid, aldehyde, azide, alkyne, cyclopentadiene, furan, and maleimide. In yet other embodiments, the at least one first multifunctional monomer is selected from the group consisting of Desmodur N3900, Desmodur N3300, Desmodur N3600, Desmodur N3800, Mondur 445, Mondur 448, Mondur 489, Mondur 582, Mondur 841, Mondur 1453, Mondur 1488, Mondur 1515, Mondur 1522, Mondur 1566, Mondur 3694, Mondur 3695, hexamethylene diisocyanate, trimethyl hexamethylene diisocyanate, methylene diphenyl diisocyanate, toluene diisocyanate, isophorone diisocyanate and any dimers, trimers, or regioisomers thereof. In yet other embodiments, the at least one first multifunctional monomer is selected from the group consisting of any DESMODUR®, BAYHYDUR®, DISPERCOLL®, BAYHYTHERM®, DESMOTHERM®, BAYBOND®, CRELAN®, DESMOCAP®, and DESMOSEAL® branded products sold by COVESTRO® AG (Kaiser-Wilhelm-Allee 60, 51373 Leverkusen, Germany). In yet other embodiments, the at least one second multifunctional monomer comprises at least one end group selected from the group consisting of an isocyanate group, cyanate group, epoxide group, Michael acceptor, primary amine, secondary amine, alcohol, thiol, carboxylic acid, aldehyde, azide, alkyne, cyclopentadiene, furan, and maleimide. In yet other embodiments, the at least one second multifunctional monomer is selected from the group consisting of Desmodur N3900, Desmodur N3300, Desmodur N3600, Desmodur N3800, Mondur 445, Mondur 448, Mondur 489, Mondur 582, Mondur 841, Mondur 1453, Mondur 1488, Mondur 1515, Mondur 1522, Mondur 1566, Mondur 3694, Mondur 3695, hexamethylene diisocyanate, trimethyl hexamethylene diisocyanate, methylene diphenyl diisocyanate, toluene diisocyanate, isophorone diisocyanate and any dimers, trimers, or regioisomers thereof. In yet other embodiments, the at least one second multifunctional monomer is selected from the group consisting of any DESMODUR®, BAYHYDUR®, DISPERCOLL®, BAYHYTHERM®, DESMOTHERM®, BAYBOND®, CRELAN®, DESMOCAP®, and DESMOSEAL® branded products sold by COVESTRO® AG (Kaiser-Wilhelm-Allee 60, 51373 Leverkusen, Germany).

In certain embodiments, the compositions and methods of U.S. Pat. Nos. 7,943,680; 8,404,758; 8,877,830; 9,012,127; 9,758,597 are incorporated herein by reference in their entireties.

In certain embodiments, the support matrix is formed by reacting the at least one first multifunctional monomer with the at least one second multifunctional monomer through at least one polymer forming reaction. In other embodiments, the at least one polymer forming reaction is selected from the group consisting of a thermally initiated reaction, a light initiated reaction, and a redox initiated reaction. In yet other embodiments, the thermally initiated reaction is selected from the group consisting of alcohol-isocyanate, alcohol-thioisocyanate, thiol-isocyanate, thiol-thioisocyanate, amine-epoxy, alcohol-epoxy, thiol-epoxy, carboxylic acid-epoxy, thiol-Michael addition, amino-Michael addition, amine-isocyante, epoxy homopolymerization, aldehyde-amine, any thermally promoted [3+2] or [4+2] cycloaddition reactions.

In certain embodiments, the RAFT functionalities of the support matrix are activated through at least one means selected from the group consisting of thermal initiation, photoinitiation and redox initiation. Activation of the RAFT functionalities enables increased diffusion by causing the network to behave as a liquid. Diffusion is known to be faster in liquids relative to a solid, static networks.

One particular function of the writing chemistry is to respond to externally applied light patterns with one or more chemical reactions that locally modify at least one property of the part being fabricated. Holographic photopolymers typically use a photoinitiator, which absorbs light to initiate a chemical reaction, and a writing monomer that undergoes at least partial polymerization. In certain embodiments, the photoreaction locally immobilizes the writing monomer via polymerization as an insoluble or non-extractable writing oligomer and/or polymer within the matrix. As used herein, the term "extractable writing monomer/oligomer" refers to a writing monomer and/or oligomer thereof that can be extracted from a solid matrix using a solvent and/or solution of appropriate composition and nature, at least because the writing monomer and/or oligomer thereof is at least partially accessible to the solvent and/or solution and is at least partially soluble in the same. An extractable writing monomer/oligomer is thus distinct from an insoluble and/or non-extractable oligomerized/polymerized writing monomer (which is oligomerized/polymerized to an non-extractable oligomer and/or polymer), which may not be extracted in significant amount from a solid matrix using a solvent and/or solution of appropriate composition and nature.

The writing step can directly modify a material's mechanical properties (such as, but not limited to, glass transition temperature, modulus, thermal expansion, and/or internal stress), optical properties (such as, but not limited to, refractive index, absorption, and/or scatter), thermal properties, chemical properties (such as, but not limited to, solubility), and so forth. For the purposes of creating optical elements such as holograms, a modification of particular interest is optical properties, particularly refractive index.

Other changes such as modulus or thermal expansion coefficient are also contemplated and useful within the invention.

In certain embodiments, the writing step can be controlled by a gradient (i.e., continuously variable in space) optical intensity and/or exposure time to result in a gradient oligomerization/polymerization of the writing monomer. This, in turn, will affect the distribution of subsequently applied filler(s) within the composite material. The spatial control of these subsequently applied fillers can increase refractive index contrast, as well as provide control over mechanical or thermal properties of the composite material. In certain embodiments, the writing chemistry can also include a photo-absorber, which controls where the light reaches, as is well known in the art of stereolithography. Photo-absorbers include, but are not limited to, pyrene, stilbene derivatives and analogues, and anthracene derivatives and analogues; non-limiting examples include 2-ethyl-9,10-dimethoxy anthracene (EDMA) or 1,4-bis(2-dimethylstyryl)benzene (BMSB).

The writing chemistry, in certain embodiments, can include additional reactive or nonreactive components (e.g. a solvent and/or a catalyst) that modifies the properties of the matrix, such as but not limited to pore size, and/or modify the properties of the writing chemistry, such as but not limited to reaction rate.

Reagents involved in the writing chemistry may undergo mobilization and/or immobilization during and/or after the writing step. Traditionally techniques have relied on this change of mobility to modify optical index response of the material to light. In such cases, transport and resulting change of properties occurs during or after exposure without further processing.

In contrast, in certain embodiments, the present invention uses one or more post-exposure processing steps to enhance certain properties of the material. Specifically, in certain non-limiting embodiments, the invention contemplates introducing one or more molecules into the exposed part of the material by contacting that exposed area with a filler, immersing that exposed area in a solution comprising a filler, and/or contacting that exposed area with a solid gel containing the filler. In such steps, soluble/extractable molecules present in the mobile matrix or writing chemistry are removed or extracted. Additionally, the post-processing step can add one or more fillers that can be reactive (e.g. a polymerizable monomer) or generally unreactive. For example, the filler can be derivatized with at least one of alcohol, thiol, isocyanate, cyanate, epoxide, Michael acceptor, vinyl, carboxylic acid, aldehyde, primary amine, secondary amine, azide, alkyne, cyclopentadiene, furan, and malemide.

The distribution of filler can be controlled by the removal processes used prior to the filler application processes. This process of removal, addition, and/or reaction of compounds after exposure can be repeated as needed to achieve desired properties.

It should be noted that, when a photopolymerizable polymer is exposed, all such materials shrink as a result of the monomers being polymerized to form the polymer. The present invention contemplates that the swelling properties of the exposed portion of the solid matrix can be manipulated so as to control its swelling with the filler. For example, a polymer with low polymerization conversion of monomer to polymer (and thus large mesh size) tends to swell more in a suitable solvent than a polymer with high polymerization conversion of monomer to polymer (and thus low mesh size). Thus, the filler will reach higher local concentrations in regions of low photopolymerization. This gradient distribution of various components will reach an equilibrium upon contact with the filler, and the equilibrium time can be reduced by heating the system and/extending exposure time during application of the filler.

The invention contemplates controlling diffusivity rates throughout the solid matrix by varying porosity and penetrability of specific regions of the solid matrix. This allows for subsequent time-dependent distribution of the filler throughout the solid matrix. This transient distribution can be locked in place with subsequent process steps such as thermally-initiated or optically-initiated polymerization.

The invention contemplates controlling diffusivity rates throughout the solid matrix by controlling any chemical reactions between the filler and the exposed part of the solid matrix. This can be achieved by modifying at least a portion of the exposed part of the solid matrix with at least functional group that can interact with the filler. Since the rate of transport of the filler throughout the solid matrix will depend on its reaction rate with the solid matrix, this would also lead to a time-dependent distribution of filler, which is distinct from a mere diffusion or swelling process.

The filler can be soluble in, or capable of penetrating into, at least some portion of the exposed part. At least one component of the filler composition can be reactive with at least some portion of the exposed part (e.g. a monomer or a material functionalized with a reactive functional group). Fillers can be molecular, metal or other nanoparticles, nanowires, liquid crystals or quantum dots. The filler composition can include catalysts, solvents, and/or other nonreactive species. The spatial distribution of filler within the composite material is controlled by the structure of the part which in turn was programmed by optical exposure of the writing chemistry.

In certain embodiments, the filler is used to modulate the viscosity, hydrophilicity and stiffness (rubbery modulus) of the unpolymerized or polymerized composition. Non-limiting examples of fillers include inorganic filler compounds such as barium, ytterbium, strontium, zirconia silicate, amorphous silica. The filler may be silanized and typically presented in the form of particles with a size ranging from 0.01 to 5.0 micrometers. In certain embodiments, the filler is a hydrophobic fumed silica. In other embodiments, the hydrophobic fumed silica filler is composed of nanoparticles or nanoclusters.

A nanoparticle is defined as any particle less than 100 nanometers (nm) in diameter. A nanocluster is an agglomeration of nanoparticles. In certain embodiments, utilization of nanoclusters in a nanosized filler can be exploited to increase the load and improve some mechanical properties. Other suitable fillers are known in the art, and include those that are capable of being covalently bonded to the impression material itself or to a coupling agent that is covalently bonded to both. Examples of suitable filling materials include but are not limited to, barium glass, ytterbium nanoglasses and nanoclusters, fumed silica, silica, silicate glass, quartz, barium silicate, strontium silicate, barium borosilicate, strontium borosilicate, borosilicate, lithium silicate, lithium alumina silicate, amorphous silica, ammoniated or deammoniated calcium phosphate and alumina, zirconia, tin oxide, and titania. Some of the aforementioned inorganic filling materials and methods of preparation thereof are disclosed in U.S. Pat. Nos. 4,544,359 and 4,547,531; pertinent portions of each of which are incorporated herein by reference. In certain embodiments, the filler is a mixture of barium glass, ytterbium nanoglasses and nanoclusters, and fumed silica. In certain embodiments, the filler is 85 wt % 0.5 micron barium glass, 10 wt % ytterbium 40 nm nanoglass and nanoclusters, 2.5 wt % Aerosil fumed silica, and 2.5 wt % Cabosil fumed silica. In other embodiments, the filler is a mixture of 90% 0.4 µm Schott glass and 10 wt % Aerosol OX-50. In certain embodiments, suitable fillers are those having a particle size in the range from about 0.01 to about 5.0 micrometers, mixed with a silicate colloid of about 0.001 to about 0.07 micrometers.

At some time during or after introduction of the filler, some reactive components of the filler may be caused to react with at least some portion of the exposed part. This reaction could be simultaneous with the introduction of the filler or triggered by a subsequent stimulus such as introduction of a catalyst, optical exposure, or heat. Note that these stimuli may vary in time and or space to provide another dimension of control. For example, structured optical illumination can react and immobilize the filler only in certain regions allowing the remaining filler to later be removed from the unexposed regions. The process of removal of unreacted components, introduction of a new filler composition and reaction of filler can be repeated as needed. In certain embodiments, the filler is derivatized with a group that can interact or react with the matrix, thus associating with the matrix.

The filler can locally modify dimensions (via swelling), modulus, stress, anisotropy, toughness, glass transition temperature, pore size, refractive index, chemical properties, or other physical characteristics as is known in the art of solid solutions and composites. In accordance with various embodiments, these modifications can be controlled on the scale of the optical wavelength via the compositional fraction of matrix, writing chemistry and filler(s), which is in turn controlled by the possibly gray-scale exposure of the writing chemistry. This enables gradient control of properties in polymer composites that is not currently possible. Holographic photopolymers in which unreacted portions of the writing chemistry diffuse use some similar processes, but the combination of (possibly multiple) exposure and external filler application steps enables greater control over and thus greater range of material properties.

Certain embodiments use covalent adaptable polymers such as reversible addition-fragmentation chain-transfer (RAFT) links in the matrix, writing chemistry and/or filler. These have been shown to rearrange the network and relax stress, either continuously or upon introduction of a stimulus such as light (typically generating radicals), heat, or a catalyst. The use of such adaptable networks can be used, in some embodiments, to control and reduce stress in the transport and exchange processes described above. Specifically, inclusion of covalent adaptable bonds ("dynamic bonds") allows the solid part to swell to a greater degree in mobile writing chemistry or filler, enabling a higher concentration of the mobile species than would otherwise be possible. Additionally, matrices comprising dynamic bonds are expected to relieve internal swelling or shrinkage stresses caused by the various material exchange steps.

FIGS. 1A-1C illustrate an example of post-processing of a photopolymer to create an enhanced refractive index change between exposed and unexposed regions in accordance with some embodiments of the present invention. Photo-exposure can be used to locally create non-extractable (immobile or insoluble) photopolymer. If the monomer is multi-functional or is able to covalently bond to the matrix, this local photopolymer will increase cross-link density and decreases the solubility of the remaining monomer in the exposed region.

Traditional techniques would wait for diffusion to transport new monomer into the exposed region, increasing the volume fraction of that species, followed by an eventual uniform polymerization to immobilize the new monomer and lock the distribution in place. There are several disadvantages of these procedures known in the art. For example, if solubility of the monomer in the exposed region is reduced, the concentration of new monomer will be reduced and this will limit the final index contrast. In addition, the transport of monomer during the optical exposure can lead to low fidelity exposures and/or scatter, reducing the quality of the recorded optical element. Diffusion within the film across large structures can take significant time. Finally, the film must remain rubbery to enable the diffusional transport and as a result, the film will thus have low modulus and high thermal expansion coefficient.

Instead, as disclosed herein, according to the present invention, monomer transport into the exposed region is unnecessary. Transport could be suppressed, e.g. by a matrix with higher than typical glass transition temperature which is heated upon post-processing to accelerate diffusion at that time. Instead, the mobile/soluble writing monomer is removed from the film. This results in a high index contrast optical element in which writing photopolymer plus matrix remains in the exposed regions and only matrix remains in the unexposed regions.

In certain embodiments, the support matrix is formed by reacting the at least one first multifunctional monomer with the at least one second multifunctional monomer through at least one polymer forming reaction. In other embodiments, the at least one polymer forming reaction is selected from the group consisting of a thermally initiated reaction, a light initiated reaction, and a redox initiated reaction. In yet other embodiments, the thermally initiated reaction is selected from the group consisting of alcohol-isocyanate, alcohol-thioisocyanate, thiol-isocyanate, thiol-thioisocyanate, amine-epoxy, alcohol-epoxy, thiol-epoxy, carboxylic acid-epoxy, thiol-Michael addition, amino-Michael addition, amine-isocyante, epoxy homopolymerization, aldehyde-amine, any thermally promoted [3+2] or [4+2] cycloaddition reactions.

In certain embodiments, the at least one writing monomer is a compound capable of undergoing radical based homopolymerization, such as but not limited to an acrylate and/or methacrylate. In yet other embodiments, the at least one writing monomer is a monofunctional monomer or a multifunctional monomer. In yet other embodiments, the at least one writing monomer is a compound having a refractive index equal to or greater than about 1.58. In yet other embodiments, the at least one writing monomer is a compound having a refractive index equal to or greater than about 1.6. In yet other embodiments, the at least one writing monomer is a compound having a refractive index equal to or greater than about 1.62. In yet other embodiments, the at least one writing monomer is a compound having a refractive index equal to or greater than about 1.64. In yet other embodiments, the at least one writing monomer is a compound having a refractive index equal to or greater than about 1.66. In yet other embodiments, the at least one writing monomer is a compound having a refractive index equal to or greater than about 1.68. In yet other embodiments, the at least one writing monomer is a compound having a refractive index equal to or greater than about 1.7.

In certain embodiments, the index contrast of the polymer matrix and the photopolymer is greater than 0.01, 0.02, 0.03, 0.04, 0.05, 0.06, 0.07, 0.08, 0.09, 0.10, 0.11, 0.12, 0.13, 0.14, 0.15, 0.16, 0.17, 0.18, 0.19, 0.20, 0.21, 0.22, 0.23, 0.24, 0.25, 0.26, 0.27, 0.28, 0.29, 0.30, 0.31, 0.32, 0.33, 0.34, 0.35, 0.36, 0.37, 0.38, 0.39, or 0.40.

In certain embodiments, the index contrast of the polymer matrix monomer(s) and the photopolymer monomer(s) is greater than 0.01, 0.02, 0.03, 0.04, 0.05, 0.06, 0.07, 0.08, 0.09, 0.10, 0.11, 0.12, 0.13, 0.14, 0.15, 0.16, 0.17, 0.18, 0.19, 0.20, 0.21, 0.22, 0.23, 0.24, 0.25, 0.26, 0.27, 0.28, 0.29, 0.30, 0.31, 0.32, 0.33, 0.34, 0.35, 0.36, 0.37, 0.38, 0.39, or 0.40.

In certain embodiments, the at least one writing monomer is at least one selected from the group consisting of an acrylate monomer and a methacrylate monomer. In other embodiments, the at least one writing monomer is at least one selected from the group consisting of tribromophenyl (meth)acrylate, pentabromophenyl (meth)acrylate, phenylthioethyl (meth)acrylate, naphthylthioethyl (meth)acrylate, tritylthioethyl (meth)acrylate,

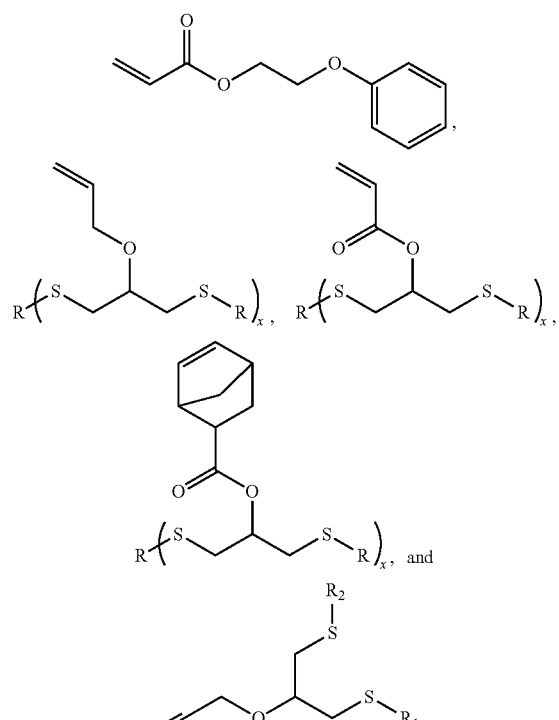

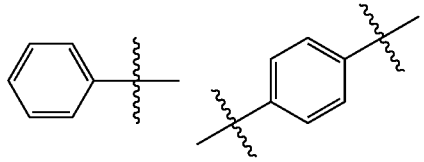

wherein x is an integer ranging from 1 to 1,000, and $R_1$ and $R_2$ are independently selected from the group consisting of monoaromatic and polyaromatic and may independently comprises at least one heteroatom (O, S, or N). $R_1$, and $R_2$ may be the same or different.

In certain embodiments, each occurrence of R is independently selected from the group consisting of:

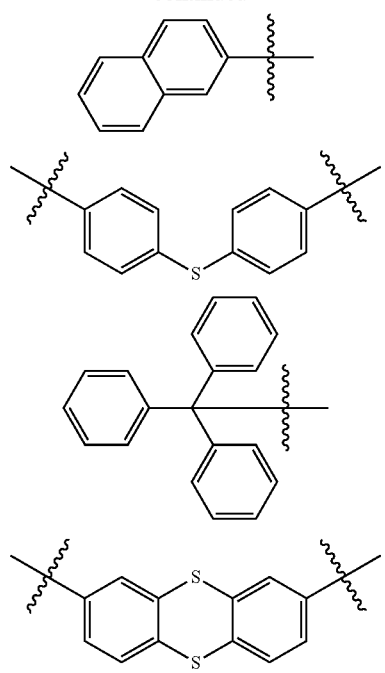

In certain embodiments, the at least one writing monomer is a photopolymerizable monomer. In other embodiments, the at least one writing monomer is polymerizable through any radical mediated polymerization method that is orthogonal to the method utilized to form the support matrix.

In certain embodiments, the composition further comprises at least one polymerization initiator selected from the group consisting of a photoinitiator, a thermal initiator, and a redox initiator.

In certain embodiments, the at least one photoinitiator is selected from the group consisting of acetophenone, benzophenone, 2-phenylacetophenone, 2,2-dimethoxy-2-phenylacetophenone, Bis(2,4,6-trimethylbenzoyl)-phenylphosphineoxide, 2-Hydroxy-4'-(2-hydroxyethoxy)-2-methylpropiophenone, 2-methyl-(4-methylthienyl)-2-morpholinyl-1-propan-1-one, Diphenyl(2,4,6-trimethylbenzoyl)phosphine oxide, Ethyl (2,4,6-trimethylbenzoyl) phenyl phosphinate, lithium phenyl-2,4,6-trimethylbenzoylphosphinate,

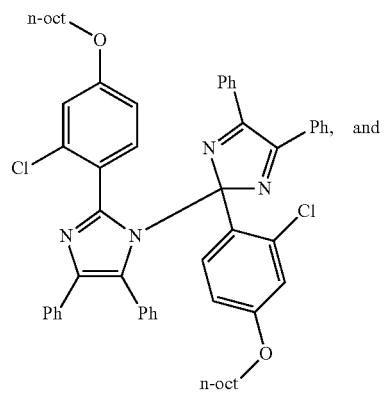

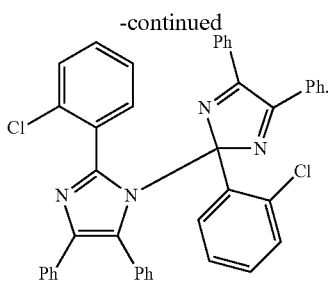

In certain embodiments, the at least one thermal initiator is selected from the group consisting of tert-Amyl peroxybenzoate, 4,4-Azobis(4-cyanovaleric acid), 1,1'-Azobis(cyclohexanecarbonitrile), 2,2'-Azobisisobutyronitrile (AIBN), Benzoyl peroxide, 2,2-Bis(tert-butylperoxy)butane, 1,1-Bis(tert-butylperoxy) cyclohexane, 2,5-Bis(tert-butylperoxy)-2,5-dimethylhexane, 2,5-Bis(tert-butylperoxy)-2,5-dimethyl-3-hexyne, Bis(1-(tert-butylperoxy)-1-methylethyl)benzene, 1,1-Bis(tert-butylperoxy)-3,3,5-trimethylcyclohexane, tert-Butyl hydroperoxide, tert-Butyl peracetate, tert-Butyl peroxide, tert-Butyl peroxybenzoate, tert-Butylperoxy isopropyl carbonate, cumene hydroperoxide, cyclohexanone peroxide, dicumyl peroxide, lauroyl peroxide, 2,4-pentanedione peroxide, peracetic acid, and potassium persulfate.

In certain embodiments, the at least one redox initiator is selected from the group consisting of sodium iodide/hydrogen peroxide, potassium iodide/hydrogen peroxide, benzoyl peroxide/dimethyaniline, benzoyl peroxide/N,N-dimethyl p-toluidine, benzoyl peroxide/4-N,N-dimethylaminophenethyl alcohol, benzoyl peroxide/ethyl 4-dimethylaminobenzoate, glucose oxidase/oxygen/iron(II) sulfate, and copper (II) sulfate/sodium ascorbate.

Removal of the mobile monomer (and oligomer), as illustrated in FIG. 1B, results in shrinkage of the film. This shrinkage can be compensated by transporting a filler into the film at the same or a later post-processing stage as illustrated in FIG. 1C. This filler can be a monomer, a functionalized nanoparticle, or a nonreactive liquid. Additional functions of this filler may include, but are not limited to the following: 1) A low refractive index filler that has reduced solubility in the previously exposed regions of the film will preferentially swell the unexposed regions; this will further increase the refractive index contrast of the part; 2) A polymerizable filler with desirable mechanical or thermal properties (e.g. high modulus or low coefficient of thermal expansion) can be used to modify these properties independent of those required during optical exposure; 3) The filler can compensate for dimensional changes of the film.

Various embodiments allow for the creation of nonuniform swelling of a hologram by a subsequently applied filler. The gradient-based filling compensations can include the other benefits documented here and these compensations can be locally controlled by the photo-exposure process. The resulting part can have higher index contrast via two mechanisms: removal of all unreacted writing monomer and introduction of a second filler whose spatial distribution is controlled by that of the photopolymer; as well as improved mechanical properties and local compensation for dimensional changes.

Figure 2:
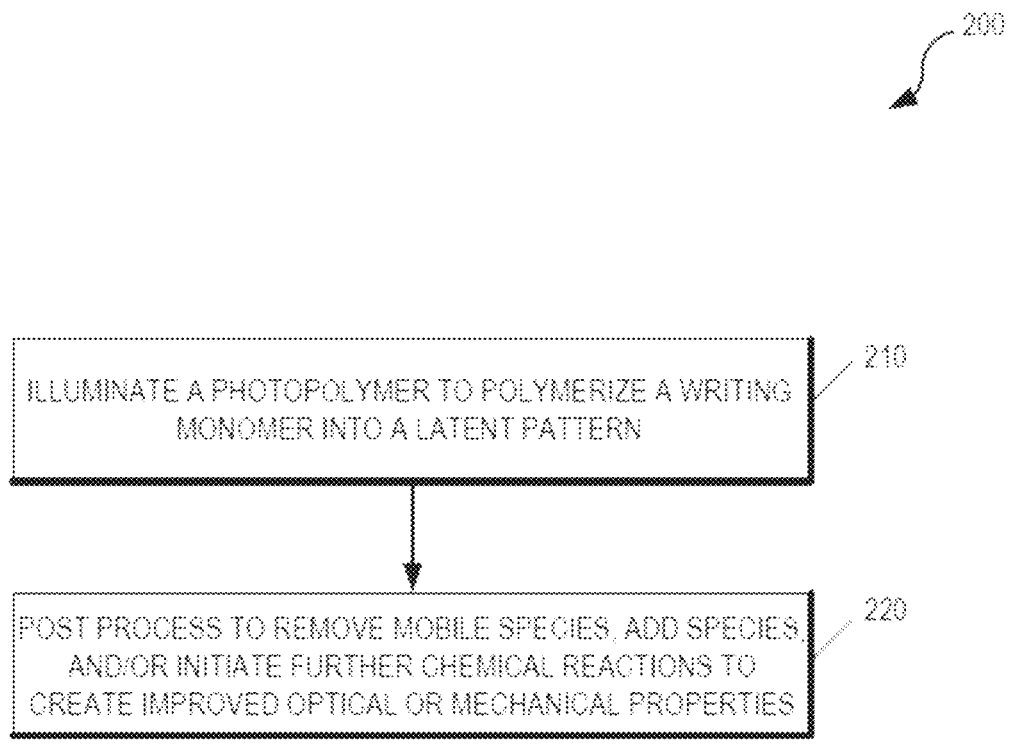
FIG. 2 illustrates a flowchart illustrating a set of operations for fabricating non-homogeneous polymer objects using light to control structure and/or composition according to certain embodiments of the present disclosure.

FIG. 2 illustrates a flowchart illustrating a set of operations 200 for fabricating inhomogeneous polymer objects using light to control structure and/or composition according to certain embodiments of the invention. As illustrated in FIG. 2, illumination operation 210 illuminates a photopolymer to polymerize a writing monomer into a latent pattern. Illumination operation 210 may include multiple illuminations to develop complex patterns with a variable gradient throughout the material. Post-processing step 220 can be used to improve the optical or mechanical properties. For example, in certain embodiments, post-processing step 220 can remove the unreacted writing monomer. This will give a large refractive index contrast because only the matrix will remain in the dark regions and the illuminated regions will have the matrix plus the high refractive index polymer. As such, removing unreacted monomer can give the material more contrast in optical and mechanical properties.

The removal of the mobile writing monomer will result in shrinkage in varying degrees in the less polymerized (e.g., dark regions) because a material has been extracted. Post-processing step 220 can reswell the less polymerized regions to create the improved refractive index contrast or mechanical properties. In certain embodiments, post-processing step 220 can add or remove other components as well as subject the material to other stimuli post exposure such as heat, pressure or strain. For example, by removing the unreacted writing monomer, this may increase the refractive index contrast and/or may reduce haze/scatter caused by the traditional post-processing flood illumination of that monomer in place.

Reaction by-products or unreacted photoinitiator can be removed in post-processing step 220. This may improve transmission by reducing absorption at certain wavelengths. It may also improve long-term stability of the film since these components are often implicated in "yellowing" or other aging of the film. A new monomer can be added to the film in some embodiments. This may swell the film to compensate for shrinkage caused by polymerization or the removal of other species. For example, this may be a contrasting refractive index. If the writing polymer has modulated the solubility of the filler, then the filler will not be uniformly distributed. This "development" step thus provides a new method to structure the material.

In certain embodiments, the filler is a monomer whose polymer form has lower refractive index than the writing monomer. This filler monomer preferentially swells regions where there is less writing photopolymer. The filler monomer is then polymerized with an appropriate photo-initiator or thermal-initiator also applied to the film. The resulting film will have higher refractive index contrast due to the concentration of high index writing polymer in illuminated regions and low index filler polymer in the dark regions.

This filler can modify the mechanical or thermal-mechanical properties of the film. The filler could be a monomer (polymerized as described elsewhere herein) that forms a hard, glassy polymer. This would increase the modulus and glass transition temperature of the film. This in turn would be expected to reduce the film coefficient of thermal expansion. The monomer could form an interpenetrating network and/or reaction with the existing polymer matrix.

In some embodiments, a new initiator can be added to the film during post-processing operation 220. The initiator could be a thermal initiator, allowing unreacted species to be thermally polymerized, and not photo-polymerized. This is expected to reduce haze caused by scattering during cure. The initiator could be a photo initiator that is sensitive at a different wavelength than the (first) writing step, allowing sequential photo-patterning at different wavelengths while avoiding the traditional need to make the two initiators work in the same formulation. The transfer can happen via addition of a solvent which speeds diffusion and generally makes transfer more complete, heating of the film to speed the transport process, addition of a liquid which will diffuse into the film, and/or lamination of a solid which allows internal diffusion (e.g. the matrix) possibly containing liquid elements. In any case, the mobile species in the exposed film will migrate out and applied mobile species will migrate in.

In some embodiments a new formulation concept is used in which the writing monomer is chosen to significantly modify properties (other than optical) of the material when polymerized. Specifically, the polymer formed in the written/illuminated area is designed to significantly modify the solubility of other components such as the writing monomer or subsequently applied filler.

The detailed description of examples of the technology is not intended to be exhaustive or to limit the technology to the precise form disclosed above. While specific examples for the technology are described above for illustrative purposes, various equivalent modifications are possible within the scope of the technology, as those skilled in the relevant art will recognize. For example, while processes or blocks are presented in a given order, alternative implementations may perform routines having steps, or employ systems having blocks, in a different order, and some processes or blocks may be deleted, moved, added, subdivided, combined, and/or modified to provide alternative or subcombinations. Each of these processes or blocks may be implemented in a variety of different ways. Also, while processes or blocks are at times shown as being performed in series, these processes or blocks may instead be performed or implemented in parallel, or may be performed at different times. Further any specific numbers noted herein are only examples: alternative implementations may employ differing values or ranges.

Definitions

As used herein, each of the following terms has the meaning associated with it in this section.

Unless defined otherwise, all technical and scientific terms used herein generally have the same meaning as commonly understood by one of ordinary skill in the art to which this invention belongs. Generally, the nomenclature used herein and the laboratory procedures in polymer chemistry and organic chemistry are those well-known and commonly employed in the art.

As used herein, the articles "a" and "an" refer to one or to more than one (i.e. to at least one) of the grammatical object of the article. By way of example, "an element" means one element or more than one element.

As used herein, the term "about" will be understood by persons of ordinary skill in the art and will vary to some extent on the context in which it is used. As used herein when referring to a measurable value such as an amount, a concentration, a temporal duration, and the like, the term "about" is meant to encompass variations of ±20% or ±10%, more preferably ±5%, even more preferably ±1%, and still more preferably ±0.1% from the specified value, as such variations are appropriate to perform the disclosed methods.

As used herein, the term "alkene monomer" or "alkene-based substrate" refers to a small molecule or a polymeric molecule comprising at least one reactive alkenyl group. An "alkenyl group" is an unsaturated, linear or branched or cyclic hydrocarbon group comprising at least one carbon-carbon double bond. In certain embodiments, the ene-based substrate comprises at least one alkenyl group (C=C).

As used herein, the term "alkyne monomer" or "alkyne-based substrate" refers to a small molecule or a polymeric molecule comprising at least one reactive alkynyl group. An "alkynyl group" is an unsaturated, linear or branched or cyclic hydrocarbon group comprising at least one carbon-carbon triple bond. In certain embodiments, the alkyne-based substrate comprises at least one terminal alkynyl group (—C≡CH).

As used herein, the term "curable" as applied to a material refers to a material comprising at least one functional group that may undergo polymerization. The curable material may be non-polymerized (i.e., non-cured material), or may be submitted to polymerization conditions (such as chemical reagents or physical conditions) that induce polymerization of at least a fraction of the at least one polymerizable functional group (i.e., partially or fully cured material). In certain embodiments, polymerization or crosslinking of the curable material results in about 100% consumption of the at least one functional group (i.e., fully cured). In other embodiments, polymerization or crosslinking of the curable material results in less than about 100% consumption of the at least one functional group (i.e., partially cured).

As used herein, the term "depolymerization" refers to the reaction wherein a polymer is at least partially converted to at least one oligomer and/or a monomer, or an oligomer is at least partially converted to at least one smaller oligomer and/or a monomer.

As used herein, the term "electromagnetic radiation" includes radiation of one or more frequencies encompassed within the electromagnetic spectrum. Non-limiting examples of electromagnetic radiation comprise gamma radiation, X-ray radiation, UV radiation, visible radiation, infrared radiation, microwave radiation, radio waves, and electron beam (e-beam) radiation. In one aspect, electromagnetic radiation comprises ultraviolet radiation (wavelength from about 10 nm to about 400 nm), visible radiation (wavelength from about 400 nm to about 750 nm) or infrared radiation (radiation wavelength from about 750 nm to about 300,000 nm). Ultraviolet or UV light as described herein includes UVA light, which generally has wavelengths between about 320 and about 400 nm, UVB light, which generally has wavelengths between about 290 nm and about 320 nm, and UVC light, which generally has wavelengths between about 200 nm and about 290 nm. UV light may include UVA, UVB, or UVC light alone or in combination with other type of UV light. In certain embodiments, the UV light source emits light between about 350 nm and about 400 nm. In some embodiments, the UV light source emits light between about 400 nm and about 500 nm.

As used herein, the term "extractable monomer/oligomer" refers to a monomer and/or oligomer thereof that can be extracted from a solid matrix using a solvent and/or solution of appropriate composition and nature, at least because the monomer and/or oligomer thereof is at least partially accessible to the solvent and/or solution and is at least partially soluble in the same. An extractable monomer/oligomer is thus distinct from an insoluble and/or non-extractable oligomerized/polymerized monomer (which is oligomerized/polymerized to an non-extractable oligomer and/or polymer), which may not be extracted in significant amount from a solid matrix using a solvent and/or solution of appropriate composition and nature.

As used herein, the term "holography" refers to the science and the practice of making holograms. Typically, a hologram is a photographic recording of a light field, rather than an image formed by a lens. The holographic medium, i.e., the object produced by a holographic process (which itself may be referred to as a hologram) is usually unintelligible when viewed under diffuse ambient light. It is an encoding of the light field as an interference pattern of variations in the opacity, density, or surface profile of the photographic medium. When suitably lit, the interference pattern diffracts the light into an accurate reproduction of the original light field, and the objects that were in it exhibit visual depth cues such as parallax and perspective that change realistically with the relative position of the observer. That is, the view of the image from different angles represents the subject viewed from similar angles.

"Instructional material" as that term is used herein includes a publication, a recording, a diagram, or any other medium of expression that can be used to communicate the usefulness of the composition and/or compound of the invention in a kit. The instructional material of the kit may, for example, be affixed to a container that contains the compound and/or composition of the invention or be shipped together with a container that contains the compound and/or composition.

As used herein, the term "Michael acceptor" refers to a molecule comprising a $\alpha,\beta$-unsaturated R group, wherein R can be for example carbonyl, carboxylic acid, carboxamide, sulfone, sulfonamide, nitro, and other unsaturated group, whereby a nucleophile or base can add to the β-position of the $\alpha,\beta$-unsaturated R group to form a covalent bond. Non-limiting examples of Michael acceptors include vinyl sulfones, methacrylates, and acrylates.

The term "monomer" refers to any discreet chemical compound of any molecular weight.

As used herein, the term "orthogonal," as applied to the conditions required to run at least two distinct chemical reactions, indicates that the conditions used to perform one of the chemical reactions do not significantly affect the ability to perform the subsequent other(s) chemical reaction(s). In a non-limiting example, reactions R1 and R2 may be performed in a system, wherein R1 is run first and R2 is run second; reactions R1 and R2 are performed under "orthogonal" conditions if reaction R1 may be performed in the system under conditions that do not affect the ability to subsequently perform reaction R2 in the system.

As used herein, the term "photoinitiator" refers to a molecule that creates reactive species (such as for example, free radicals, cations or anions) when exposed to electromagnetic radiation such as UV or visible light.

As used herein, the term "polymer" refers to a molecule composed of repeating structural units typically connected by covalent chemical bonds. The term "polymer" is also meant to include the terms copolymer and oligomers. In certain embodiments, a polymer comprises a backbone (i.e., the chemical connectivity that defines the central chain of the polymer, including chemical linkages among the various polymerized monomeric units) and a side chain (i.e., the chemical connectivity that extends away from the backbone).

As used herein, the term "polymerization" or "crosslinking" refers to at least one reaction that consumes at least one functional group in a monomeric molecule (or monomer), oligomeric molecule (or oligomer) or polymeric molecule (or polymer), to create at least one chemical linkage between at least two distinct molecules (e.g., intermolecular bond), at least one chemical linkage within the same molecule (e.g., intramolecular bond), or any combinations thereof. In certain embodiments, polymerization includes copolymerization oligomerization. A polymerization or crosslinking reaction may consume between about 0% and about 100% of the at least one functional group available in the system. In certain embodiments, polymerization or crosslinking of at least one functional group results in about 100% consumption of the at least one functional group. In other embodiments, polymerization or crosslinking of at least one functional group results in less than about 100% consumption of the at least one functional group.

As used herein, the term "RAFT" refers to reversible addition-fragmentation chain transfer. As used herein, in a reversible chain cleavage process both chain cleavage and chain recombination occur. Recombination may occur through simple reversal of the chain cleavage reaction. In addition, the products of the chain cleavage reaction at one cleavage location are capable of participating in additional chain cleavage reactions, allowing combination of chain fragments from different cleavage locations and chain rearrangement. For example, the reversible chain cleavage process may be an addition-fragmentation process in which a radical reacts with an in-chain addition-fragmentation functionality to form an intermediate, which in turn fragments to reform the initial functionality and a new radical. The new radical may further react with another in-chain functionality or the initial functionality may further react with another radical generated by a different addition-fragmentation event. Chain rearrangement resulting from the reversible chain cleavage process can alter the topology of the network.

As used herein, "step-growth polymerization" refers to a type of polymerization mechanism wherein bifunctional or multifunctional monomers react first to form dimers, then trimers, then eventually long chain polymers. In the event of multi-functional monomers, crosslinked polymers are produced.

As used herein, the term "reaction condition" refers to a physical treatment, chemical reagent, or combination thereof, which is required or optionally required to promote a reaction. Non-limiting examples of reaction conditions are electromagnetic radiation (such as, but not limited to visible light), heat, a catalyst, a chemical reagent (such as, but not limited to, an acid, base, electrophile or nucleophile), and a buffer.

As used herein, the term "reactive" as applied to thiol, isocyanate, oxirane, alkyne or alkene groups indicate that these groups under appropriate conditions may take part in one or more reactions as defined in this application.

As used herein, the term "thiol-ene reaction" refers to an organic reaction between a thiol monomer and an ene monomer. In certain embodiments, the ene monomer is an $\alpha,\beta$-unsaturated ester, acid, sulfone, nitrile, ketone, amide, aldehyde, or nitro compound (Hoyle, et al., Angew. Chem. Intl Ed., 2010, 49(9):1540-1573); the thio-ene reaction involving such reactants is known as "thiol-Michael reaction."

As used herein, the term "thiol-ene polymerization" refers to polymerization wherein at least one thiol-ene reaction takes place.

As used herein, the term "Type I photoinitiator" refers to a compound that undergoes a unimolecular bond cleavage upon irradiation to yield free radicals. Non-limiting examples of Type I photoinitiators are benzoin ethers, benzyl ketals, $\alpha$-dialkoxy-acetophenones, $\alpha$-hydroxy-alkylphenones, $\alpha$-amino-alkylphenones and acyl-phosphine oxides.

As used herein, the term "Type II photoinitiator" refers to a combination of compounds that undergo a bimolecular reaction where the excited state of the photoinitiator interacts with a second molecule (often known as "co-initiator") to generate free radicals.

Throughout this disclosure, various aspects of the invention may be presented in a range format. It should be understood that the description in range format is merely for convenience and brevity and should not be construed as an inflexible limitation on the scope of the invention. Accordingly, the description of a range should be considered to have specifically disclosed all the possible sub-ranges as well as individual numerical values within that range and, when appropriate, partial integers of the numerical values within ranges. For example, description of a range such as from 1 to 6 should be considered to have specifically disclosed sub-ranges such as from 1 to 3, from 1 to 4, from 1 to 5, from 2 to 4, from 2 to 6, from 3 to 6 etc., as well as individual numbers within that range, for example, 1, 2, 2.7, 3, 4, 5, 5.3, and 6. This applies regardless of the breadth of the range.

Those skilled in the art will recognize, or be able to ascertain using no more than routine experimentation, numerous equivalents to the specific procedures, embodiments, claims, and examples described herein. Such equivalents were considered to be within the scope of this invention and covered by the claims appended hereto. For example, it should be understood, that modifications in reaction conditions, including but not limited to reaction times, reaction size/volume, and experimental reagents, such as solvents, catalysts, pressures, atmospheric conditions, e.g., nitrogen atmosphere, and reducing/oxidizing agents, with art-recognized alternatives and using no more than routine experimentation, are within the scope of the present application.

It is to be understood that wherever values and ranges are provided herein, all values and ranges encompassed by these values and ranges, are meant to be encompassed within the scope of the present invention. Moreover, all values that fall within these ranges, as well as the upper or lower limits of a range of values, are also contemplated by the present application.

The examples discussed herein illustrate aspects of the present invention. However, they are in no way a limitation of the teachings or disclosure of the present invention as set forth herein.

Enumerated Embodiments

The following exemplary embodiments are provided, the numbering of which is not to be construed as designating levels of importance:

Embodiment 1 provides a method of generating a composite material, the method comprising: illuminating a solid matrix comprising a soluble photopolymerizable writing monomer and a photoinitiator, under conditions whereby at least a fraction of the photopolymerizable writing monomer polymerizes to form a latent pattern within the solid matrix; extracting at least a fraction of any remaining extractable photopolymerizable writing monomer/oligomer from the solid matrix, thus generating a system; and contacting a filler with the system, wherein the latent pattern controls distribution of the filler within the system, thus generating the composite material.

Embodiment 2 provides the method of Embodiment 1, wherein the illuminating step is repeated at least twice, so as to form a latent pattern within the solid matrix.

Embodiment 3 provides the method of any of Embodiments 1-2, wherein the illuminating step(s) is/are performed so as to create a gradient of extractable photopolymerizable writing monomer/oligomer within the solid matrix.

Embodiment 4 provides the method of any of Embodiments 1-3, wherein the matrix includes reversible covalent bonds that allow for swelling or deswelling, so that there is release of at least a fraction of any internal stress in the composite material caused by extraction of any remaining extractable photopolymerizable writing monomer/oligomer or distribution of the filler within the composite material.

Embodiment 5 provides the method of any of Embodiments 1-4, wherein the method further comprises promoting at least partial equilibration of the reversible covalent bonds by applying an external stimulus after formation of the composite material so as to release at least a fraction of any internal stress.

Embodiment 6 provides the method of any of Embodiments 4-5, wherein the reversible covalent bonds are continuously subject to equilibration conditions as to release at least a fraction of any internal stress.

Embodiment 7 provides the method of any of Embodiments 5-6, wherein the external stimulus is at least one of light, heat, or catalyst.

Embodiment 8 provides a method of generating a composite material, the method comprising: illuminating a solid matrix comprising a soluble photopolymerizable writing monomer and photoinitiator, under conditions whereby at least a fraction of the photopolymerizable writing monomer polymerizes to form a latent pattern within the solid matrix; extracting at least a fraction of any remaining extractable photopolymerizable writing monomer/oligomer from the solid matrix, thus generating a system; and post-processing the system to remove at least one material from the system or add at least one material to the system, so as to modify at least one chemical, optical, or mechanical property of the system, thus generating the composite material.

Embodiment 9 provides the method of Embodiment 8, wherein the illuminating step is repeated at least twice, so as to form a latent pattern within the solid matrix.

Embodiment 10 provides the method of any of Embodiments 8-9, wherein the illuminating step(s) is/are performed so as to create a gradient of extractable photopolymerizable writing monomer/oligomer within the solid matrix.

Embodiment 11 provides the method of any of Embodiments 8-10, wherein the latent pattern controls introduction of a filler into the system during post-processing.

Embodiment 12 provides the method of Embodiment 11, wherein the filler comprises a group capable of forming a reversible covalent bond with the composite material, and wherein the filler is capable of swelling or de-swelling within the composite material.

Embodiment 13 provides the method of any of Embodiments 8-12, wherein the method further comprising promoting at least partial equilibration of the reversible covalent bond during a post-processing operation to release at least a fraction of any internal stress within the composite material.

Embodiment 14 provides the method of any of Embodiments 12-13, wherein the reversible covalent bond is activated by applying a base to the composite material.

Embodiment 15 provides a composite material having a gradient refractive index throughout its structure, the composite material comprising: a matrix polymer; an at least partially polymerizedphotopolymerizable writing monomer, defining a pattern within the composite material; a filler, which distribution within the composite material is directed by the pattern within the composite material; and optionally a polymerization initiator.

Embodiment 16 provides the composite material of Embodiment 16, wherein the polymerization initiator is a catalyst, a thermal initiator, or a photoinitiator.

Embodiment 17 provides the composite material of any of Embodiments 15-16, wherein the matrix polymer is a polyurethane.

Embodiment 18 provides the composite material of any of Embodiments 15-17, wherein the refractive index of at least partially polymerized photopolymerizable writing monomer is higher than the refractive index of the matrix polymer.

Embodiment 19 provides a method for generating a composite material, the method comprising: illuminating at least a fraction of a first polymer matrix, wherein the first polymer matrix comprises a photopolymerizable writing monomer and a photoinitiator, under conditions that allow for forming a photopolymer within the first polymer matrix; thus generating a system; and post-processing the system in at least one the following manners: contacting at least one filler with the system under conditions that allow for at least one filler to be incorporated into the system; extracting at least one extractable molecule from the system; or introducing at least one extractable molecule into the system.

Embodiment 20 provides the method of Embodiment 19, wherein the illuminating step(s) is/are performed so as to create a gradient of soluble photopolymerizable writing monomer within the matrix.

Embodiment 21 provides the method of any of Embodiments 19-20, wherein at least a fraction of any extractable writing monomer/oligomer is removed during the post-processing step.

Embodiment 22 provides the method of any of Embodiments 19-21, wherein at least a fraction of any photoinitiator or photo-initiator reaction products is removed during the post-processing step.

Embodiment 23 provides the method of any of Embodiments 19-22, wherein the at least one filler is selected from the group consisting of a molecule, metal or other nanoparticles, nanowires, liquid crystals, and quantum dots.

Embodiment 24 provides the method of any of Embodiments 19-23, wherein the at least one filler comprises a second polymerizable monomer.

Embodiment 25 provides the method of Embodiment 24, wherein the second polymerizable monomer comprises at least one of alcohol, thiol, isocyanate, cyanate, epoxide, Michael acceptor, vinyl, carboxylic acid, aldehyde, primary amine, secondary amine, azide, alkyne, cyclopentadiene, furan, and malemide.

Embodiment 26 provides the method of any of Embodiments 24-25, wherein the second polymerizable monomer is photopolymerable.

Embodiment 27 provides the method of any of Embodiments 24-26, wherein the second polymerizable monomer is thermopolymerable.

Embodiment 28 provides the method of any of Embodiments 24-27, wherein the post-processing step further comprises incorporating a first filler into the system, further processing the system, and incorporating a second filler into the system, thus forming the composite material.

Embodiment 29 provides the method of any of Embodiments 24-28, wherein the index contrast of the first polymer matrix and the photopolymer is greater than 0.1.

Embodiment 30 provides the method of any of Embodiments 24-29, wherein the post-processing step comprises covalently attaching the filler to the first polymer matrix.

The disclosures of each and every patent, patent application, and publication cited herein are hereby incorporated herein by reference in their entirety. While this invention has been disclosed with reference to specific embodiments, it is apparent that other embodiments and variations of this invention may be devised by others skilled in the art without departing from the true spirit and scope of the invention. The appended claims are intended to be construed to include all such embodiments and equivalent variations.

What is claimed is:

1. A method of generating a composite material, the method comprising:
   illuminating a composite material comprising:
      a three dimensional solid scaffold comprising reversible covalent bonds that allow for release of internal stress in the composite material,
      a mobile soluble photopolymerizable material having a refractive index of about 1.58 to about 1.7, and
      a photoinitiator;
   wherein the solid scaffold comprises at least one region exposed to illumination and at least one region unexposed to illumination;
   photopolymerizing a fraction of the photopolymerizable material to form an immobile insoluble latent pattern in the solid scaffold and retaining at least one mobile unpolymerized fraction of the photopolymerizable material in the at least one region unexposed to illumination;
   extracting the at least one mobile unpolymerized fraction from the composite material; and
   transporting a filler into the composite material to replace the extracted mobile unpolymerized fraction, wherein the latent pattern controls distribution of the filler within the composite material,
   wherein the illuminating is repeated one or more times before or after the photopolymerizing step, the extracting step, or the transporting step; and
   wherein the filler is at least one of a polymerizable filler material, metal or other nanoparticles, nanowires, liquid crystals, or quantum dots.

2. The method of claim 1, wherein the extracting comprises removing the mobile unpolymerized fraction from the composite material using a solvent.

3. The method of claim 1, wherein the method further comprises applying an external stimulus to the composite material to release at least a fraction of any internal stress.

4. The method of claim 3, wherein the external stimulus is at least one of light, heat, base, or catalyst.

5. The method of claim 1, wherein the at least one filler is a polymerizable filler material.

6. The method of claim 5, wherein the polymerizable filler material comprises at least one chemical moiety selected from the group consisting of alcohol, thiol, isocyanate, cyanate, epoxide, Michael acceptor, vinyl, carboxylic acid, aldehyde, primary amine, secondary amine, azide, alkyne, cyclopentadiene, furan, and maleimide.

7. The method of claim 1, wherein the index contrast of the solid scaffold and the photopolymerizable material is greater than 0.1.

8. The method of claim 1, wherein the filler comprises particles with a size of 0.01 to 5.0 micrometers.

9. The method of claim 8, wherein the filler further comprises a silicate colloid with particle sizes of about 0.001 to about 0.07 micrometers.

10. The method of claim 1, wherein the filler is at least one of the following:
    i) a mixture of barium glass, ytterbium nanoglasses and nanoclusters, and fumed silica;
    ii) silanized particles with a size of 0.01 to 5.0 micrometers;
    iii) 85 wt % 0.5 micron barium glass, 10 wt % ytterbium 40 nm nanoglass and nanoclusters, 5 wt % fumed silica; and
    iv) a mixture of 90% 0.4 micrometer Schott glass and 10 wt % fumed silica.

11. The method of claim 1, wherein the filler is at least one of a polymerizable filler material, metal or other nanoparticles, nanowires, or quantum dots.

12. A composite material having a gradient refractive index throughout its structure, the composite material comprising÷ a three dimensional solid scaffold polymer
    wherein the material further comprises:
       a region exposed to illumination and a region unexposed to illumination;

an at least partially polymerized photopolymerizable material having a refractive index of about 1.58 to about 1.7, defining a latent pattern in the solid scaffold;

a filler distributed within the composite material as directed by the latent pattern within the composite material; and optionally a polymerization initiator, wherein the solid scaffold polymer comprises reversible covalent bonds that allow for release of internal stress in the composite material, wherein the filler is at least one of a polymerizable filler material, metal or other nanoparticles, nanowires, liquid crystals, or quantum dots, and wherein the glass transition temperature of the solid matrix scaffold polymer is sufficiently high that transport of the photopolymerizable material from the unexposed region to the exposed region during illumination of the writing monomer is suppressed.

13. The composite material of claim 12, wherein the polymerization initiator is a catalyst, a thermal initiator, or a photoinitiator.

14. The composite material of claim 12, wherein the refractive index of at least partially polymerized photopolymerizable material is higher than the refractive index of the solid scaffold polymer.

15. The composite material of claim 12, wherein the filler is at least one of the following:

i) a mixture of barium glass, ytterbium nanoglasses and nanoclusters, and fumed silica;

ii) silanized particles with a size of 0.01 to 5.0 micrometers;

iii) 85 wt % 0.5 micron barium glass, 10 wt % ytterbium 40 nm nanoglass and nanoclusters, 5 wt % fumed silica; and iv) a mixture of 90% 0.4 micrometer Schott glass and 10 wt % fumed silica.

16. The composition of claim 12, wherein the filler is at least one of a polymerizable filler material, metal or other nanoparticles, nanowires, or quantum dots.

* * * * *